(12) United States Patent
Nakaya et al.

(10) Patent No.: US 8,932,676 B2
(45) Date of Patent: Jan. 13, 2015

(54) METHOD FOR PRODUCING GAS BARRIER PLASTIC MOLDED BODY

(75) Inventors: Masaki Nakaya, Chuo-ku (JP); Midori Takiguchi, Chuo-ku (JP); Mari Shimizu, Chuo-ku (JP); Aiko Sato, Chuo-ku (JP); Hiroyasu Tabuchi, Chuo-ku (JP); Eitaro Matsui, Chuo-ku (JP)

(73) Assignee: Kirin Beer Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/976,798

(22) PCT Filed: Dec. 28, 2011

(86) PCT No.: PCT/JP2011/080399
§ 371 (c)(1),
(2), (4) Date: Aug. 6, 2013

(87) PCT Pub. No.: WO2012/091095
PCT Pub. Date: Jul. 5, 2012

(65) Prior Publication Data
US 2013/0323423 A1 Dec. 5, 2013

(30) Foreign Application Priority Data
Dec. 28, 2010 (JP) ................ 2010-293651

(51) Int. Cl.
*C23C 16/00* (2006.01)
*C09D 5/00* (2006.01)
(Continued)

(52) U.S. Cl.
CPC ............... *C09D 5/00* (2013.01); *C23C 16/045* (2013.01); *C23C 16/401* (2013.01)
USPC ........... 427/255.29; 427/237; 427/249.15; 427/255.37; 427/255.394; 427/589

(58) Field of Classification Search
USPC ........ 427/237, 249.15, 255.37, 255.394, 589, 427/255.29
See application file for complete search history.

(56) References Cited

U.S. PATENT DOCUMENTS

| 5,204,141 A | 4/1993 | Roberts et al. |
| 5,770,301 A * | 6/1998 | Murai et al. .................. 428/213 |

(Continued)

FOREIGN PATENT DOCUMENTS

| CN | 1826425 | 8/2006 |
| CN | 101184669 | 5/2008 |

(Continued)

OTHER PUBLICATIONS

Written Opinion of PCT/JP2011/080399 dated Mar. 13, 2012.
(Continued)

*Primary Examiner* — Elizabeth Burkhart
(74) *Attorney, Agent, or Firm* — Sughrue Mion, PLLC (57) ABSTRACT

Provided is a method for producing a gas barrier plastic molded body by forming a gas barrier thin film which is substantially colorless and has gas barrier properties, on the surface of a plastic molded body by a heating element CVD method using only raw material gases that are highly safe. The method for producing a gas barrier plastic molded body according to the present invention is a method for producing a gas barrier plastic molded body (90) by forming a gas barrier thin film (92) on the surface of a plastic molded body (91), the method comprising: a film-forming process in which the gas barrier thin film (92) is formed on the surface of the plastic molded body by a heating element CVD method, using an organosilane-based compound represented by formula (Chemical Formula 1) as a main raw material gas, using an oxidizing gas as an additive gas, and using a heating element containing tantalum (Ta) as a main constituent element:

$$H_3Si-C_n-X \qquad \text{(Chemical Formula 1)}$$

wherein in Chemical Formula 1, n represents 2 or 3; and X represents $SiH_3$, H, or $NH_2$.

8 Claims, 3 Drawing Sheets

(51) Int. Cl.
*C23C 16/04* (2006.01)
*C23C 16/40* (2006.01)

(56) References Cited

U.S. PATENT DOCUMENTS

| | | | |
|---|---|---|---|
| 2005/0239643 A1* | 10/2005 | Benderly et al. ............... | 502/312 |
| 2006/0177575 A1 | 8/2006 | Takemoto et al. | |
| 2009/0061111 A1* | 3/2009 | Mishima et al. ............... | 427/589 |
| 2010/0096393 A1 | 4/2010 | Asahara et al. | |
| 2010/0233886 A1* | 9/2010 | Yang et al. ..................... | 438/786 |
| 2012/0205279 A1 | 8/2012 | Mishima et al. | |
| 2014/0183706 A1 | 7/2014 | Yang et al. | |

FOREIGN PATENT DOCUMENTS

| | | |
|---|---|---|
| CN | 101636523 | 1/2010 |
| EP | 0 533 129 A2 | 3/1993 |
| EP | 1 884 472 A1 | 2/2008 |
| EP | 2 228 465 A1 | 9/2010 |
| JP | 5-195228 A | 8/1993 |
| JP | 2005-200043 A | 7/2005 |
| JP | 2008-127053 A | 6/2008 |
| JP | 2010-219533 A | 9/2010 |
| KR | 100362133 | 3/2003 |
| KR | 1020060047441 | 5/2006 |
| KR | 1020080021613 | 3/2008 |
| KR | 1020100103436 | 9/2010 |
| TW | 201034079 | 9/2010 |
| WO | 9628299 | 9/1996 |
| WO | 2006/126677 A1 | 11/2006 |
| WO | 2008/062730 A1 | 5/2008 |

OTHER PUBLICATIONS

Office Action for Canadian Application No. 2,822,597 dated Jun. 4, 2014.
Matsumoto, "Hot wire-CVD deposited a-$SiO_x$ and its characterization", Thin Solid Films, 501(1-2):95-97 (2006).
First Notification of Office Action for Chinese Application No. 201180062773.7 dated Aug. 5, 2014.
Notice of Preliminary Rejection for Korean Patent Application No. 10-2013-7019880 dated Sep. 30, 2014 English Translation.

* cited by examiner

FIG.3

METHOD FOR PRODUCING GAS BARRIER PLASTIC MOLDED BODY

CROSS REFERENCE TO RELATED APPLICATIONS

This application is a National Stage of International Application No. PCT/JP2011/080399, filed on Dec. 28, 2011, which claims priority from Japanese Patent Application No. 2010-293651, filed on Dec. 28, 2010, the contents of all of which are incorporated herein by reference in their entirety.

TECHNICAL FIELD

The present invention relates to a method for producing a gas barrier plastic molded body.

BACKGROUND ART

Gas barrier properties have been hitherto imparted to the surface of a plastic molded body by forming a thin film thereon. Methods of laminating a thin film having gas barrier properties (hereinafter, also referred to as a gas barrier thin film), which contains an inorganic oxide as a main component, on the inner surface of a plastic container using a plasma chemical vapor deposition method (plasma CVD method), have been disclosed (see, for example, Patent Literature 1). However, in regard to a method for forming a thin film by a plasma CVD method, plasma damages the film surface at the time of thin film formation so that the compactness of the film is prone to be impaired, and it is difficult to obtain high gas barrier properties. Furthermore, since a plasma CVD method ionizes a raw material gas by decomposing the raw material gas with plasma, and causes ions that have been accelerated by an electric field to collide with the surface of a plastic container to form a thin film thereon, the method essentially requires a high frequency power supply and a high frequency electric power adjusting apparatus, and there is a problem that a large amount of money is required for the equipment cost.

A method of decomposing a raw material gas by bringing the raw material gas into contact with a heating element that has been caused to generate heat, and depositing the chemical species thus produced as a thin film on a base material directly or after a reaction process in a gas phase, that is, a CVD method which is also called a heating element CVD method, a Cat-CVD method or a hot wire CVD method (hereinafter, in the present specification, referred to as a heating element CVD method), has attracted public attention as a next-generation film forming method, because the method can solve the problems of the plasma CVD method as described above, and can form a compact thin film having high gas barrier properties by using a film-forming apparatus that is simpler and less expensive than the film-forming apparatuses for the plasma CVD method. However, when a silicon hydride such as monosilane, disilane or trisilane is used as a raw material gas, because these compounds have pyrophoricity, expenses are required for safety apparatuses, and the advantage of lower cost compared to the film-forming apparatuses for the plasma CVD method fades away. Thus, the applicant of the present invention has suggested a technology for forming a $SiO_x$ thin film or an $AlO_x$ thin film on the wall surface of a plastic container by a heating element CVD method, using a highly safe raw material such as a non-pyrophoric raw material as a raw material gas (see, for example, Patent Literature 2).

CITATION LIST

Patent Literature

Patent Literature 1: JP 2005-200043 A
Patent Literature 2: JP 2008-127053 A

SUMMARY OF INVENTION

Technical Problem

Since $SiO_x$ thin films are colorless and transparent, and have high gas barrier properties, those thin films are widely applied as gas barrier thin films. However, $SiO_x$ thin films are known to have a problem in water resistance. A $SiO_x$ thin film acquires satisfactory adhesiveness to plastic substrates when carbon is incorporated into the thin film; however, if the content of carbon is increased, a problem of coloration occurs, and there are limitations on the applications. So far, not much interest has been paid to a method of forming a gas barrier thin film which is substantially colorless and has gas barrier properties, using a heating element CVD method and using only raw material gases that are highly safe.

An object of the present invention is to provide a method for forming a gas barrier thin film which is substantially colorless and has gas barrier properties, on the surface of a plastic molded body using a heating element CVD method and using only raw material gases that are highly safe as compared with the case of using silanes, trimethylaluminum or the like.

Solution to Problem

A method for producing a gas barrier plastic molded body according to the present invention is a method for producing a gas barrier plastic molded body by forming a gas barrier thin film on the surface of a plastic molded body, and the method comprising: a film-forming process in which the gas barrier thin film is formed on the surface of the plastic molded body by a heating element chemical vapor deposition (CVD) method, using an organosilane-based compound represented by formula (Chemical Formula 1) as a main raw material gas, using an oxidizing gas as an additive gas, and using a heating element containing tantalum (Ta) as a main constituent element:

(Chemical Formula 1)

wherein in Chemical Formula 1, n represents 2 or 3; and X represents $SiH_3$, H, or $NH_2$.

In the method for producing a gas barrier plastic molded body according to the present invention, the organosilane-based compound is preferably vinylsilane. A thin film having excellent gas barrier properties can be safely and efficiently formed, as compared with the case of using silanes, trimethylaluminum or the like.

In the method for producing a gas barrier plastic molded body according to the present invention, the oxidizing gas preferably comprises carbon dioxide. Control of the degree of oxidation of the film is made possible, and high gas barrier properties can be exhibited, in spite of less coloration. Particularly, when carbon dioxide is used, the degree of oxidation of the film can be easily controlled, and the so-called process window can be widened.

The method for producing a gas barrier plastic molded body according to the present invention includes an embodiment in which the mixing ratio between carbon dioxide and the organosilane-based compound is 6:100 to 260:100.

The method for producing a gas barrier plastic molded body according to the present invention includes an embodiment in which the oxidizing gas comprises oxygen, and the mixing ratio between oxygen and the organosilane-based compound is 4:100 to 130:100.

The method for producing a gas barrier plastic molded body according to the present invention includes an embodiment in which the plastic molded body is a film, a sheet, or a container.

The method for producing a gas barrier plastic molded body according to the present invention includes an embodiment in which the heating element is tantalum metal (Ta), a tantalum-based alloy, or tantalum carbide ($TaC_x$).

In the method for producing a gas barrier plastic molded body according to the present invention, the method preferably comprising, after the film-forming process, a regenerating process for the heating element in which an oxidizing gas is supplied to the atmosphere and the heating element is heated. When film formation is continuously carried out on a plural number of molded bodies under the same conditions, the gas barrier properties of the films formed in the latter half becoming poorer than the gas barrier properties of the films formed in the first half can be suppressed.

Advantageous Effects of Invention

The present invention can provide a method for forming a thin film which is substantially colorless and has gas barrier properties, on the surface of a plastic molded body by a heating element CVD method, using only raw material gases that are highly safe.

DESCRIPTION OF EMBODIMENTS

Next, the present invention will be described in detail by way of embodiments, but the present invention is not construed to be limited to these descriptions. So long as the effects of the present invention are provided, various modifications of the embodiments may be made.

Figure 1:
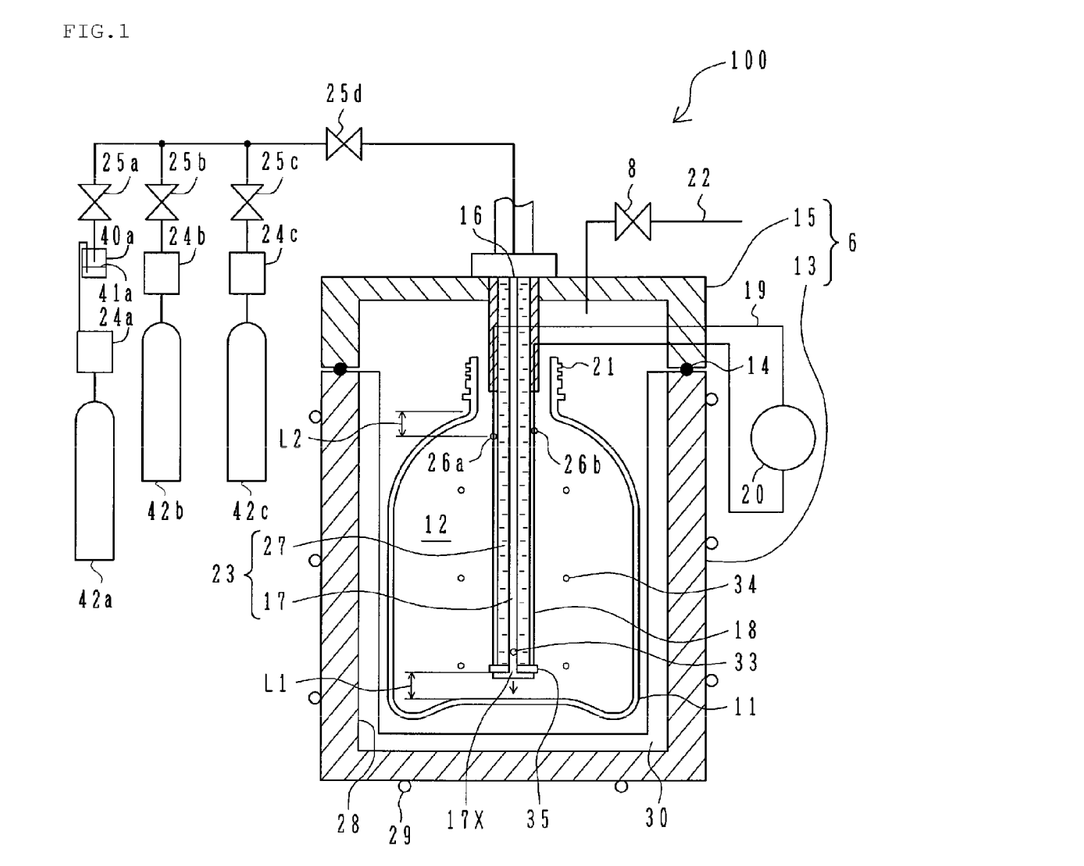
FIG. 1 is a schematic diagram illustrating an embodiment of a film-forming apparatus.

First, a film-forming apparatus that is capable of forming a gas barrier thin film on the surface of a plastic molded body will be explained. FIG. 1 is a schematic diagram illustrating an embodiment of the film-forming apparatus. The film-forming apparatus illustrated in FIG. 1 is an apparatus capable of forming a thin film, in the case where the plastic molded body is a container, on the inner surface of the container.

The film-forming apparatus 100 illustrated in FIG. 1 includes a vacuum chamber 6 that accommodates a plastic container 11 as a plastic molded body; an exhaust pump (not illustrated in the diagram) that draws a vacuum in the vacuum chamber 6; a raw material gas supply pipe 23 formed from an insulating and heat resistant material, which is disposed to be insertable and removable from the interior of the plastic container 11 and supplies a raw material gas into the interior of the plastic container 11; a heating element 18 supported by the raw material gas supply pipe 23; and a heater power supply 20 that generates heat by passing electricity through the heating element 18.

The vacuum chamber 6 has formed therein a space for accommodating the plastic container 11, and the space serves as a reaction chamber 12 for thin film formation. The vacuum chamber 6 is composed of a lower chamber 13; and an upper chamber 15 that is mounted to be attachable and detachable from the upper part of this lower chamber 13 and is configured to tightly seal the interior of the lower chamber 13 with an O-ring 14. The upper chamber 15 includes a vertically driving mechanism that is not illustrated in the diagram, and this mechanism moves up and down along with the carry-in and carry-out of the plastic container 11. The internal space of the lower chamber 13 is formed to be slightly larger than the outer shape of the plastic container 11 that is accommodated therein.

The interior of the vacuum chamber 6, particularly the interior of the lower chamber 13, is preferably such that in order to prevent reflection of the light radiated upon heat generation of the heating element 18, the inner surface 28 forms a black inner wall, or the inner surface has surface asperities with a surface roughness (Rmax) of 0.5 μm or greater. The surface roughness (Rmax) is measured using, for example, a surface roughness meter (manufactured by Ulvac Techno, Ltd.; DEKTAX3). In order to make the inner surface 28 into a black inner wall, a plating treatment such as black nickel plating or black chromium plating; a chemical coating film treatment such as Raydent/black oxide finish; or a method of coloring by applying a black coating material may be used. Furthermore, it is preferable to provide a cooling unit 29 such as a cooling pipe through which cooling water flows, in the inside or outside of the vacuum chamber 6, and to thereby prevent a temperature rise in the lower chamber 13. In the vacuum chamber 6, particularly the lower chamber 13 is targeted because when the heating element 18 is inserted into the plastic container 11, the heating element 18 is in a state of being exactly fitted in the internal space of the lower chamber 13. By preventing reflection of light and performing cooling of the vacuum chamber 6, a temperature rise in the plastic container 11 and subsequent thermal deformation can be suppressed. Furthermore, when a chamber 30 formed from a transparent body through which the radiation light generated from the electrified heating element 18 can pass, for example, a chamber made of glass, is disposed inside the lower chamber 13, since the temperature of the glass chamber that is in contact with the plastic container 11 does not rise easily, the thermal effect exerted to the plastic container 11 can be further reduced.

The raw material gas supply pipe 23 is supported to be suspended downward at the center of the inner ceiling surface of the upper chamber 15. In the raw material gas supply pipe 23, a raw material gas 33 and an additive gas, or optionally a carrier gas are introduced via flow rate regulators 24a, 24b and 24c, and valves 25a, 25b, 25c and 25d. In regard to the supply of the raw material gas 33, when the material used as the raw material gas 33 is a liquid, the material can be supplied by a bubbling method. That is, a bubbling gas is supplied from a gas cylinder 42a to the starting raw material 41a accommodated in a raw material tank 40a while the flow rate is controlled by a flow rate regulator 24a, and a vapor of the starting raw material 41a is generated and supplied as the raw material gas 33. A carrier gas is accommodated in a gas cylinder 42c, and is supplied while the flow rate is controlled by a flow rate regulator 24c. In the film-forming apparatus illustrated in FIG. 1, when the material used as the raw material gas is a gas, modification may be made such that the raw material tank 40a is not provided, and the raw material gas is filled in the gas cylinder 42a and is supplied while the flow rate is controlled by the flow rate regulator 24a.

It is preferable that the raw material gas supply pipe 23 have a cooling pipe and be formed in an integrated form. An example of the structure of such a raw material gas supply pipe 23 may be a double pipe structure. In regard to the raw material gas supply pipe 23, the inner pipeline of the double pipe serves as a raw material gas flow channel 17, and one end thereof is connected to a gas supply port 16 provided in the upper chamber 15, while the other end serves as a gas outlet port 17x. It is set up such that the raw material gas is thereby blown through the gas outlet port 17x at the tip of the raw material gas flow channel 17 that is connected to the gas supply port 16. On the other hand, the outer pipeline of the double pipe is a cooling water flow channel 27 for cooling the raw material gas supply pipe 23, and plays the role as a cooling pipe. Also, when the heating element 18 is electrified and generates heat, the temperature of the raw material gas flow channel 17 rises. In order to prevent this, cooling water is circulating through the cooling water flow channel 27. That is, at one end of the cooling water flow channel 27, cooling water is supplied from a cooling water supply unit, which is not illustrated in the diagram, connected to the upper chamber 15, and at the same time, the cooling water that has accomplished cooling is returned to the cooling water supply unit. On the other hand, the other end of the cooling water flow channel 27 is sealed in the vicinity of the gas outlet port 17x, and the cooling water is turned back and returned here. The cooling water flow channel 27 cools the entirety of the raw material gas supply pipe 23. Through cooling, the thermal effect exerted on the plastic container 11 can be reduced. Therefore, the material for the raw material gas supply pipe 23 is desirably an insulator having high heat conductivity. For example, the raw material gas supply pipe is preferably a ceramic pipe formed from a material containing aluminum nitride, silicon carbide, silicon nitride, or aluminum oxide as a main component; or a metal pipe having the surface coated with a material containing aluminum nitride, silicon carbide, silicon nitride or aluminum oxide as a main component. Such a material enables the heating element to be stably electrified, has durability, and can efficiently exhaust the heat generated at the heating element through thermal conduction.

According to another form that is not illustrated in the diagram, the raw material gas supply pipe 23 may also have a configuration as follows. That is, the raw material gas supply pipe is made into a double pipe, and the outer pipeline is used as a raw material gas flow channel. Holes, and preferably a plural number of holes, are bored in the side wall of the outer pipe. On the other hand, the inner pipe of the double pipe of the raw material gas supply pipe is formed with a compact pipe, and cooling water is allowed to flow therethrough as a cooling water flow channel. The heating element is wired along the side wall of the raw material gas supply pipe, but the raw material gas that has passed through the holes provided in the side wall of the outer pipe is brought into contact with the heating element in the area along the side wall, and can efficiently produce chemical species.

If the gas outlet port 17x is too far apart from the bottom of the plastic container 11, it is difficult to form a thin film in the inside of the plastic container 11. In the present embodiment, the length of the raw material gas supply pipe 23 is preferably formed such that the distance L1 from the gas outlet port 17x to the bottom of the plastic container 11 is 5 mm to 50 mm. Uniformity of the film thickness is enhanced. At a distance of 5 mm to 50 mm, a uniform thin film can be formed on the inner surface of the plastic container 11. If the distance is larger than 50 mm, it may be difficult to form a thin film on the bottom of the plastic container 11. Furthermore, if the distance is smaller than 5 mm, blowing of the raw material gas may be difficult, or the film thickness distribution may be non-uniform. This fact can also be understood theoretically. In the case of a container having a volume of 500 ml, since the shell diameter of the container is 6.4 cm, and the mean free path of air at normal temperature, $\lambda$ is from 0.68/Pa [cm], the molecular flow is such that pressure<0.106 Pa, the viscous flow is such that pressure>10.6 Pa, and the intermediate flow is such that 0.106 Pa<pressure<10.6 Pa. At a gas pressure of 5 Pa to 100 Pa at the time of film formation, the flow of gas is converted from an intermediate flow to a viscous flow, and there may be optimal conditions for the distance between the gas outlet port 17x and the bottom of the plastic container 11.

The heating element 18 accelerates decomposition of the raw material gas in the heating element CVD method. Since the heating element is electrically conductive, heat generation by the heating element itself through electrification is made possible. The heating element 18 is formed in a wire form, and one end of the heating element 18 is connected to a connection area 26a that serves as a connection site between a wire 19 and the heating element 18, which is provided below a fixed site in the upper chamber 15 of the raw material gas supply pipe 23. The heating element 18 is then supported by an insulating ceramic 35 provided at the gas outlet port 17x, which is a tip part. Furthermore, the heating element is turned back, and the other end of the heating element 18 is connected to a connection area 26b. As such, since the heating element 18 is supported along the side surface of the raw material gas supply pipe 23, the heating element 18 is disposed so as to be positioned almost on the main axis of the internal space of the lower chamber 13. FIG. 1 illustrates the case in which the heating element 18 is disposed along the circumference of the raw material gas supply pipe 23 so as to be parallel to the axis of the raw material gas supply pipe 23; however, starting from the connection area 26a as a starting point, the heating element 18 may also be wound in a helical shape along the side surface of the raw material gas supply pipe 23, supported by an insulating ceramic 35 fixed in the vicinity of the gas outlet port 17x, and then turned back toward the connection area 26b. Here, the heating element 18 is fixed to the raw material gas supply pipe 23 by being hung up on the insulating ceramic 35. FIG. 1 illustrates the case in which the heating element 18 is disposed on the exit side of the gas outlet port 17x in the vicinity of the gas outlet port 17x of the raw material gas supply pipe 23. Since the raw material gas blown out through the gas outlet port 17x can be thereby easily brought into contact with the heating element 18, the raw material gas can be efficiently activated. Here, it is preferable that the heating element 18 be disposed to be slightly apart from the side surface of the raw material gas supply pipe 23. This is done in order to prevent a rapid temperature rise of the raw material gas supply pipe 23. Also, the chances of contact between the raw material gas blown out through the gas outlet port 17x and the raw material gas in the reaction chamber 12 can be increased. The outer diameter of the raw material gas supply pipe 23 including this heating element 18 is necessarily smaller than the inner diameter of an opening 21 of the plastic container. This is because the raw material gas supply pipe 23 including the heating element 18 should be inserted through the opening 21 of the plastic container. Therefore, if the heating element 18 is separated apart more than needed from the surface of the raw material gas supply pipe 23, when the raw material gas supply pipe 23 is inserted through the opening 21 of the plastic container, the heating element is more likely to be brought into contact with the opening. When the positional shift at the time of insertion through the opening 21 of the plastic container is considered, the breadth of the heating element 18 appropriately more than or equal to 10 mm, and less than or equal to (inner diameter of opening 21-6) mm. For example, the inner diameter of the opening 21 is generally 21.7 mm to 39.8 mm.

The heating element 18 can be caused to generate heat by, for example, electrification. In the apparatus illustrated in FIG. 1, a heater power supply 20 is connected to the heating element 18 via the connection areas 26a and 26b, and the wire 19. When electricity is passed through the heating element 18 by the heater power supply 20, the heating element 18 generates heat. Meanwhile, the present invention is not intended to be limited to the heat generation method using the heating element 18. The upper limit temperature at the time of causing the heating element 18 to generate heat is preferably set to a temperature lower than the softening temperature of the heating element. At a temperature higher than or equal to the softening temperature, the heating element may be deformed, and control thereof may be made impossible.

Furthermore, concerning the part from the opening 21 of the plastic container to the shoulder of the container, since the stretch ratio at the time of molding of the plastic container 11 is small, if the heating element 18 that generates heat at a high temperature is disposed nearby, the part may be easily deformed by heat. According to an experiment, unless the positions of the connection areas 26a and 26b, which are the connection sites between the wire 19 and the heating element 18, were separated by 10 mm or more from the lower end of the opening 21 of the plastic container, the shoulder area of the plastic container 11 underwent thermal deformation. If the distance was greater than 50 mm, it was difficult to form a thin film on the shoulder area of the plastic container 11. Thus, it is desirable that the heating element 18 be disposed such that the upper end is located 10 mm to 50 mm below from the lower end of the opening 21 of the plastic container. That is, it is preferable that the distance L2 between the connection areas 26a and 26b and the lower end of the opening 21 be set to 10 mm to 50 mm. Thermal deformation of the shoulder part of the container can be suppressed.

Furthermore, in the internal space of the upper chamber 15, an exhaust pipe 22 is in communication with the space through a vacuum valve 8, and air in the reaction chamber 12 inside the vacuum chamber 6 is exhausted therethrough by an exhaust pump that is not illustrated in the diagram.

The film-forming apparatus illustrated in FIG. 1 does not require a high frequency power supply, and the apparatus is less expensive than the film-forming apparatuses for the plasma CVD method. An apparatus for forming the gas barrier thin film 92 on the inner surface of a plastic container has been described; however, in order to form the gas barrier thin film 92 on the outer surface of a plastic container, for example, film formation can be carried out using the film-forming apparatus illustrated in FIG. 4 of Patent Literature 2. Furthermore, in the case where the plastic molded body is a film or a sheet, the gas barrier thin film 92 can be formed on the surface of the film or sheet by, for example, making the reaction chamber 12 in a cylindrical shape, and fixing the film or sheet along the inner wall of the reaction chamber. Furthermore, a modification may also be made, in which a winding apparatus which includes a roll that sends out a film or sheet in a roll form, and a roll that rolls up the film or sheet on which a thin film has been formed, is provided in the vacuum chamber 6. Furthermore, the film-forming apparatus is not intended to be limited to the apparatus illustrated in FIG. 1, and for example, various modifications such as disclosed in Patent Literature 2 can be made.

Figure 2:
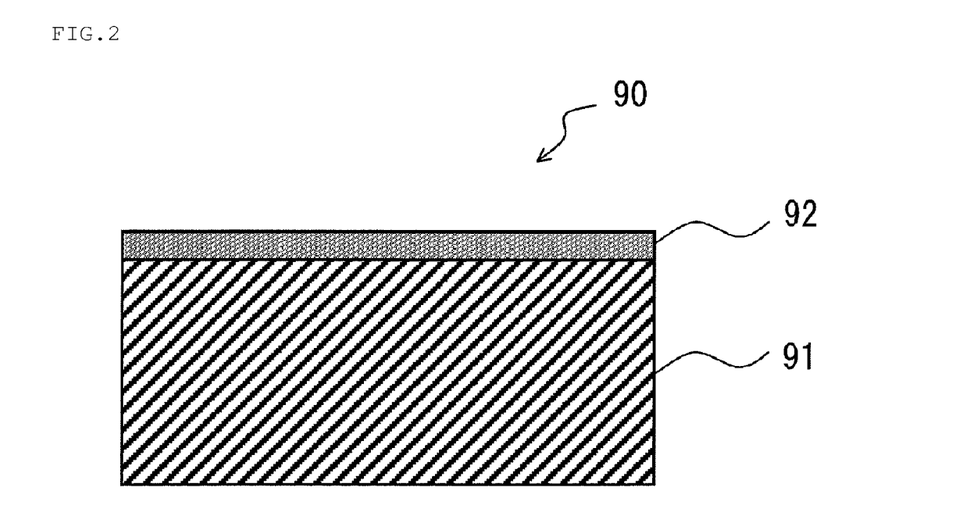
FIG. 2 is a cross-sectional view illustrating an example of a gas barrier plastic molded body according to an embodiment of the present invention.

Next, the method for producing a gas barrier plastic molded body according to the present embodiment will be described with reference to FIG. 1. FIG. 2 is a cross-sectional view illustrating an example of the gas barrier plastic molded body according to the present embodiment. The method for producing a gas barrier plastic molded body according to the present embodiment is a method for producing a gas barrier plastic molded body 90, by which a gas barrier thin film 92 is formed on the surface of a plastic molded body 91, the method including a film-forming process in which a gas barrier thin film 92 is formed on the surface of the plastic molded body 91 (in FIG. 1, inner surface of the plastic container 11) by a heating element CVD method, using an organosilane-based compound represented by Formula (Chemical Formula 1) as a main raw material gas 33, using an oxidizing gas as an additive gas, and using a heating element 18 containing tantalum (Ta) as a main constituent element:

$$H_3Si\text{—}C_n\text{—}X \quad \text{(Chemical Formula 1)}$$

wherein in Chemical Formula 1, n represents 2 or 3; and X represents $SiH_3$, H, or $NH_2$.

(Mounting of Plastic Molded Body in Film-Forming Apparatus)

First, the interior of the vacuum chamber 6 is opened to the atmosphere by opening a vent (not illustrated in the diagram). In the reaction chamber 12, the plastic container 11 is inserted as the plastic molded body 91 through the upper opening of the lower chamber 13, while the upper chamber 15 is removed, and is accommodated therein. Thereafter, the upper chamber 15 that has been positioned is lowered down, and the raw material gas supply pipe 23 attached to the upper chamber 15, and the heating element 18 that is fixed thereto are inserted into the plastic container 11 through the opening 21 of the plastic container. Then, the upper chamber 15 comes into contact with the lower chamber 13 with an O-ring 14 inserted therebetween, and thereby, the reaction chamber 12 is made into a tightly sealed space. At this time, the distance between the inner wall surface of the lower chamber 13 and the outer wall surface of the plastic container 11 is maintained almost uniformly, and the distance between the inner wall surface of the plastic container 11 and the heating element 18 is also maintained almost uniformly.

The plastic molded body 91 is illustrated in the form of a container in FIG. 1, but the plastic molded body is not intended to be limited to this, and includes a film form or a sheet form. The shape can be appropriately set in accordance with the purpose and use, and is not particularly limited. The container includes a container used after being covered with a lid, stoppered or sealed, or a container that is used in an open state without using those coverings. The size of the opening can be appropriately set in accordance with the content. The plastic container includes a plastic container having appropriate rigidity and a predetermined thickness, and a plastic container formed using a sheet material which does not have rigidity. The present invention is not intended to the limited to the method for producing a container. Examples of the content include beverages such as water, tea beverages, soft drinks, carbonated beverages, and fruit juice beverages; and foods in the form of a liquid, a viscous material, a powder or a solid. Furthermore, the container may be any of a returnable container, or a one-way container. The film or sheet includes a long sheet-like object, and a cut sheet. It does not matter whether the film or sheet is a stretched product or an unstretched product. The present invention is not intended to be limited to the method for producing the plastic molded body 91.

Examples of the resin that constitutes the plastic molded body 91 include a polyethylene terephthalate resin (PET), a polybutylene terephthalate resin, a polyethylene naphthalate resin, a polyethylene resin, a polypropylene resin (PP), a cycloolefin copolymer resin (COC, cyclic olefin copolymer), an ionomer resin, a poly-4-methylpentene-1 resin, a polymethyl methacrylate resin, a polystyrene resin, an ethylene-vinyl alcohol copolymer resin, an acrylonitrile resin, a polyvinyl chloride resin, a polyvinylidene chloride resin, a polyamide resin, a polyamideimide resin, a polyacetal resin, a polycarbonate resin, a polysulfone resin, a tetrafluoroethylene resin, an acrylonitrile-styrene resin, and an acrylonitrile-butadiene-styrene resin. These can be used as a single layer of one kind, or as a laminate of two or more kinds; however, in view of productivity, a single layer is preferred. Also, the kind of the resin is more preferably PET.

The thickness of the plastic molded body 91 can be appropriately set in accordance with the purpose and use, and is not particularly limited. When the plastic molded body 91 is, for example, a container such as a bottle for beverages, the thickness of the bottle is preferably 50 µm to 500 µm, and more preferably 100 µm to 350 µm. Furthermore, when the plastic molded body is a film which constitutes a multiwall paper sack, the thickness of the film is preferably 3 µm to 300 µm, and more preferably 10 µm to 100 µm. When the plastic molded body 91 is a substrate for a flat panel display such as an electronic paper or an organic EL, the thickness of the film is preferably 25 µm to 200 µm, and more preferably 50 µm to 100 µm. Furthermore, when the plastic molded body is a sheet for forming a container, the thickness of the sheet is preferably 50 µm to 500 µm, and more preferably 100 µm to 350 µm. Also, when the plastic molded body 91 is a container, the gas barrier thin film 92 is provided on any one side or on both sides of the inner wall surface and the outer wall surface. Furthermore, when the plastic molded body 91 is a film, the gas barrier thin film 92 is provided on one surface or on both surfaces.

(Pressure Regulation Process)

Next, the vent (not illustrated in the diagram) is closed, and the exhaust pump (not illustrated in the diagram) is operated to open the vacuum valve 8, and thereby, the reaction chamber 12 is evacuated. At this time, not only the internal space of the plastic container 11 but also the space between the outer wall surface of the plastic container 11 and the inner wall surface of the lower chamber 13 are also evacuated, and thereby a vacuum is drawn. That is, the entirety of the reaction chamber 12 is evacuated. Then, it is preferable that the pressure inside the reaction chamber 12 be reduced until the pressure reaches a required level, for example, 1.0 Pa to 100 Pa. More preferably, the pressure is 1.4 Pa to 50 Pa. If the pressure is lower than 1.0 Pa, the evacuation time may take long. Also, if the pressure is higher than 100 Pa, the amount of impurities may increase inside the plastic container 11, and high barrier properties may not be imparted. When the pressure is reduced from atmospheric pressure to reach 1.4 Pa to 50 Pa, an appropriate residual water vapor pressure originating from the atmosphere, apparatus and container can be obtained together with an appropriate vacuum pressure, and an oxide thin film having barrier properties can be formed conveniently and easily.

(Electrification of Heating Element)

Next, the heating element 18 is caused to generate heat by, for example, electrification. The heating element 18 contains tantalum (Ta) as a main constituent element, and examples include an embodiment formed of tantalum metal, and an embodiment formed of an alloy of tantalum and another metal forming an alloy with tantalum, such as tungsten or niobium. In the case of an alloy, the alloy preferably contains tantalum in an amount of 90% by mass or more. More preferably, the tantalum content is 99% by mass or more, and even more preferably 99.9% or more. The heat generation temperature of the heating element 18 is preferably 1600° C. or higher, and more preferably 1700° C. or higher. Also, the upper limit temperature of the heat generation temperature is preferably set to a temperature lower than the softening temperature of the heating element. At a temperature higher than or equal to the softening temperature, the heating element 18 may be deformed, and control thereof may not be enabled. The upper limit temperature is preferably 2400° C., and more preferably 2100° C.

The heating element 18 includes an embodiment of being formed of tantalum carbide ($TaC_X$). The proportion of carbon atoms in tantalum carbide ($TaC_X$) is preferably, as amass ratio, more than 0% by mass and less than or equal to 6.2% by mass, and more preferably more than 3.2% by mass and less than or equal to 6.2% by mass. At this time, the element concentration of carbon atoms in tantalum carbide ($TaC_X$) is preferably more than 0 at. % (atomic o, atom %) and less than or equal to 50 at. %, and more preferably more than 33 at. % and less than or equal to 50 at. %. Here, containing tantalum (Ta) as a main constituent element means that the material of the heating element contains tantalum atoms at an element concentration of 50 at. % or more.

(Introduction of Raw Material Gas)

Thereafter, the raw material gas 33 is supplied at a predetermined flow rate with the gas flow rate regulator 24a, and an additive gas is supplied at a predetermined flow rate with the gas flow rate regulator 24b. Furthermore, if necessary, a carrier gas is mixed with the raw material gas 33 in front of the valve 25d while the flow rate is controlled with the gas flow rate regulator 24c. The carrier gas is, for example, an inert gas such as argon, helium or nitrogen. Then, the raw material gas 33 and the additive gas are blown, while the flow rates are controlled with the gas flow rate regulators 24a and 24b, or while the flow rates are controlled by the carrier gas, toward the heating element 18 that has generated heat, through the gas outlet port 17x of the raw material gas supply pipe 23 inside the plastic container 11 where the pressure has been reduced to a predetermined pressure. As such, it is preferable to initiate spraying of the raw material gas 33 after an increase in temperature of the heating element 18 is completed. From an early stage of film formation, a chemical species 34 that has been sufficiently activated by the heating element 18 can be produced, and adhesiveness thereof to the plastic molded body can be further increased.

When the material used as the raw material gas 33 is a liquid, the material can be supplied by a bubbling method. The bubbling gas that is used for the bubbling method is, for example, an inert gas such as nitrogen, argon or helium, and nitrogen gas is more preferred. That is, when the starting raw material 41a inside the raw material tank 40a is bubbled using a bubbling gas that is filled in a gas cylinder 42a while the flow rate is controlled with a gas flow rate regulator 24a, the starting raw material 41a is vaporized and is incorporated into bubbles. In this manner, the raw material gas 33 is supplied in a state of being mixed with the bubbling gas.

The raw material gas 33 is mainly an organosilane-based compound represented by formula (Chemical Formula 1). In Chemical Formula 1, when n=2, embodiment examples of Cn include an embodiment in which the bond between C—C is a single bond ($C_2H_4$); an embodiment in which the bond between C—C is a double bond ($C_2H_2$); and an embodiment in which the bond between C—C is a triple bond ($C_2$). When n=3, embodiment examples of Cn include an embodiment in which the bonds between C—C are single bonds ($C_3H_6$); an embodiment in which the bonds between C—C are a single bond and a double bond ($C_3H_4$); and an embodiment in which the bonds between C—C are a single bond and a triple bond ($C_3H_2$). Specifically, examples of the organosilane-based compound represented by formula (Chemical Formula 1) include vinylsilane ($H_3SiC_2H_3$), disilabutane ($H_3SiC_2H_4SiH_3$), disilylacetylene ($H_3SiC_2SiH_3$), and 2-aminoethylsilane ($H_3SiC_2H_2NH_2$). These can be used singly or in combination. Among these, vinylsilane is more preferred from the viewpoint of having high film-forming efficiency.

In the present embodiment, if the organosilane-based compound represented by formula (Chemical Formula 1) is the main raw material gas, a mixed gas obtained by mixing an auxiliary raw material gas with the main raw material gas may be supplied as the raw material gas. Here, the main raw material gas is such that the content of the organosilane-based compound represented by formula (Chemical Formula 1) is 50% by volume or more relative to the total volume of the raw material gas. The content is more preferably 80% by volume or more, and particularly preferably 90% by volume or more. When an auxiliary raw material gas is used, the raw material cost can be lowered, and a gas barrier plastic molded body can be obtained more inexpensively. Examples of the auxiliary raw material gas include acetylene, methane and ethane.

The amount of supply of the raw material gas 33 is not particularly limited, but is preferably 3 sccm to 200 sccm. The amount of supply is more preferably 30 sccm to 500 sccm. In the case of supplying the raw material gas by a bubbling method, the flow rate of the bubbling gas is preferably 3 sccm to 80 sccm, and more preferably 10 sccm to 50 sccm.

The additive gas contains an oxidizing gas. Examples of the oxidizing gas include oxygen ($O_2$), ozone ($O_3$), water vapor ($H_2O$), and carbon dioxide ($CO_2$). Among these, carbon dioxide is more preferred. In the present invention, it is preferable to exclude the laughing gas (dinitrogen monoxide; $N_2O$) as the oxidizing gas.

The amount of supply of the additive gas may vary with the kind of the oxidizing gas, but for example, when the oxidizing gas is carbon dioxide, it is preferable that the mixing ratio of the amount of supply of carbon dioxide and the amount of supply of the raw material gas 33 be 6:100 to 260:100. It is more preferable that the amount of supply of carbon dioxide be 20 to 200 relative to 100 of the amount of supply of the raw material gas ($CO_2$:raw material gas=1:5 to 2:1), and it is particularly preferable that the amount of supply of carbon dioxide be 40 to 100 relative to 100 of the amount of supply of the raw material gas ($CO_2$:raw material gas=1:2.5 to 1:1). Furthermore, when the oxidizing gas is oxygen, it is preferable that the mixing ratio of the amount of supply of oxygen and the amount of supply of the raw material gas 33 be preferably 4:100 to 130:100. It is more preferable that the amount of supply of oxygen be 10 to 100 relative to 100 of the amount of supply of the raw material gas ($O_2$:raw material gas=1:10 to 1:1), and it is particularly preferable that the amount of supply of oxygen be 12 to 50 relative to 100 of the amount of supply of the raw material gas ($O_2$:raw material gas=1:8.3 to 0.5:1). That is, to explain the case where the flow rate of the raw material gas is 50 sccm as an example, when the oxidizing gas is carbon dioxide, it is preferable to adjust the flow rate of carbon dioxide to from 3 sccm to 130 sccm, more preferably to from 10 sccm to 100 sccm, and particularly preferably to from 20 sccm to 50 sccm. Furthermore, when the oxidizing gas is oxygen, it is preferable to adjust the flow rate of oxygen to from 2 sccm to 65 sccm, more preferably to from 5 sccm to 50 sccm, and particularly preferably to from 6 sccm to 25 sccm.

The flow rate of the carrier gas is not particularly limited, but the flow rate is preferably 0 sccm to 80 sccm. More preferably, the flow rate is 5 sccm to 50 sccm. Meanwhile, in the present specification, when the flow rate of the carrier gas is 0 sccm, it means that the carrier gas is not used, and only the raw material gas 33 and the additive gas are supplied. In this case, the gas flow rate regulator 24c is not used.

(Film Formation)

When the raw material gas 33 and the additive gas are brought into contact with the heating element 18, a chemical species 34 containing Si, C and O as constituent elements is produced. When this chemical species 34 arrives at the inner wall of the plastic container 11, a gas barrier thin film containing at least silicon, carbon and oxygen as constituent elements is deposited. In regard to the formation of the gas barrier thin film, the time taken for causing the heating element 18 to generate heat and spraying the raw material gas 33 and the additive gas to the heating element 18 (hereinafter, also called the duration of film formation) is preferably 0.5 seconds to 10 seconds, and more preferably 1.0 second to 6.0 seconds. The pressure inside the vacuum chamber at the time of film formation is, for example, preferably reduced until a pressure of 1.0 Pa to 100 Pa is attained. The pressure is more preferably 1.4 Pa to 50 Pa.

In the heating element CVD method, the adhesiveness between the plastic container 11 and the thin film thus formed is very good. When hydrogen gas is introduced through the raw material gas flow channel 17, the hydrogen gas is activated by a contact decomposition reaction with the heating element 18, and cleaning of the surface of the plastic container 11 can be carried out using this active species. More specifically, a hydrogen abstraction reaction or an etching operation by means of activated hydrogen H* or hydrogen radical (atomic hydrogen) H can be expected, and can be utilized in, for example, an enhancement of the adhesiveness of the thin film.

Furthermore, when $NH_3$ gas is introduced through the raw material gas flow channel 17, an active species is produced by a contact decomposition reaction with the heating element 18, and a surface treatment of modifying the surface of the plastic container 11 and thereby stabilizing the surface can be carried out by means of the active species. More specifically, addition of a nitrogen-containing functional group to the surface, or a crosslinking reaction of the polymer chains of the plastic can be expected.

(Completion of Film Formation)

When the thin film has acquired a predetermined thickness, supply of the raw material gas 33 is stopped. Subsequently, the reaction chamber 12 is evacuated again, and then a leak gas that is not illustrated in the diagram is introduced therein to thereby adjust the pressure in the reaction chamber 12 to atmospheric pressure. Thereafter, the upper chamber 15 is opened, and the plastic container 11 is taken out. In the method for producing a gas barrier plastic molded body according to the present embodiment, the film thickness of the gas barrier thin film 92 is preferably adjusted to 5 nm to 100 nm. The film thickness is more preferably 10 nm to 85 nm, and particularly preferably 30 nm to 50 nm. If the film thickness is less than 5 nm, high gas barrier properties may not be exhibited. If the film thickness is larger than 100 nm, transparency may decrease, and generation of cracks in the thin film may easily occur. Also, it is economically inefficient.

The heating element CVD method uses a simpler apparatus and can lower the cost of the apparatus itself, as compared with other chemical vapor deposition methods such as a plasma CVD method, or physical vapor deposition (PVD) methods such as a vacuum deposition method, a sputtering method, and an ion plating method. Furthermore, in the heating element CVD method, since a gas barrier thin film is formed by deposition of a chemical species, a compact film having a high apparent density can be obtained as compared with wet methods.

In the case of forming a thin film using the aforementioned organosilane-based compound represented by formula (Chemical Formula 1) as the raw material gas, when a plasma CVD method is used, the oxygen permeability of a 500-ml PET bottle is suppressed only up to about ½ of the original value, and this is insufficient in view of practical performance. When a thin film formed of DLC or $SiO_x$ is formed by a plasma CVD method, it is known that the oxygen permeability of a 500-ml PET bottle can be reduced to 1/10 or less of the original value. However, when a carbonated beverage is filled therein, the gas barrier properties deteriorate along with expansion of the bottle. Specifically, when 4 GV (gas volumes) of carbonated water is filled in a 500-ml PET bottle (resin amount 23 g) in which a DLC film or a $SiO_x$ film has been formed by a plasma CVD method, and the bottle is maintained for 5 days under the conditions of 38° C., usually the capacity of the PET bottle expands by 18 $cm^3$ to 21 $cm^3$ (in the case of a PET bottle that has not been subjected to film formation, 22 $cm^3$ to 26 $cm^3$), and the oxygen permeability after expansion increases to 1.5 to 2.9 times. These results comprehensively illustrate the expansion of PET bottles and the damage in the thin film caused by the expansion. On the other hand, in the case of forming a thin film using the organosilane-based compound represented by formula (Chemical Formula 1) as the raw material gas, when a heating element CVD method is used, the oxygen permeability in a 500-ml PET bottle can be reduced to, for example, 1/10 or less of the original value, and sufficient practical performance can be obtained. Furthermore, when a carbonated beverage is filled therein, expansion of the bottle can be effectively suppressed, and the gas barrier properties substantially do not deteriorate. Specifically, when 4 GV (gas volumes) of carbonated water is filled in a 500-ml PET bottle (resin amount 23 g) in which a film has been formed by using a heating element CVD method, and the bottle is maintained for 5 days under the conditions of 38° C., usually the bottle capacity expands only by 13 $cm^3$ to 17 $cm^3$ (in the case of a bottle that has not been subjected to film formation, 22 $cm^3$ to 26 $cm^3$), and the oxygen permeability after the expansion is limited to an increase to 1.2 to 1.3 times.

The gas barrier thin film 92 formed as such is substantially colorless. According to the present specification, being substantially colorless means that when the degree of coloration b* value, which is a color difference according to JIS K 7105-1981 "Testing methods for optical properties of plastics," is used as an index, the b* value is 6 or less. The b* value is more preferably 5 or less, and particularly preferably 4 or less. The b* value can be determined by Mathematical Formula 1. In the Mathematical Formula 1, X, Y and Z are tristimulus values.

$$b^* = 200[(Y/Y_0)^{1/3} - (Z/Z_0)^{1/3}]$$ [Mathematical Formula 1]

In a gas barrier molded body where substantially colorless transparency is required, the Barrier Improvement Factor (hereinafter, referred to as BIF), which is determined Mathematical Formula 2, is preferably 2. The barrier improvement factor is more preferably 5 or more, and particularly preferably 8 or more. In a specific example, when the container capacity of a gas barrier plastic container is set to 500 milliliters, the oxygen permeability is preferably 0.0175 cc/container/day or less. The oxygen permeability is more preferably 0.0058 cc/container/day or less, and particularly preferably 0.0035 cc/container/day or less. Meanwhile, the evaluation methods for the film thickness of the gas barrier thin film 92 and the oxygen permeability are as described in the section of Examples.

BIF=[Oxygen permeability of plastic molded body without a thin film formed therein]/[oxygen permeability of gas barrier plastic molded body] (Mathematical Formula 2)

According to the present embodiment, the reason for supplying an oxidizing gas together with an organosilane-based compound represented by formula (Chemical Formula 1) is as follows. If only the organosilane-based compound represented by formula (Chemical Formula 1) is supplied, a thin film thus obtainable mainly contains silicon (Si) and carbon (C) as constituent elements, and has very high gas barrier properties. However, the thin film has golden color originating from carbon element, so that the thin film is not suitable for the applications where being substantially colorless is required. On the other hand, when an appropriate amount of an oxidizing gas is added to the organosilane-based compound represented by formula (Chemical Formula 1), a thin film thus obtainable contains oxygen (O) in addition to Si and C as constituent elements, and a substantially colorless thin film having gas barrier properties that are in a range suitable for practical use can be obtained. Furthermore, by using Ta or tantalum carbide ($TaC_x$) as the heating element, a thin film which is substantially colorless and has gas barrier properties can be formed efficiently and stably.

The ratio of the content of O with respect to the total content of Si, C and O in the gas barrier thin film ({O [at. %]/(Si+C+O) [at. %]}×100) is preferably adjusted to 30% to 70%. The ratio is more preferably 40% to 60%. Since carbon dioxide as an oxidizing gas has mild oxidizing power as compared with oxygen, the content of oxygen element in the thin film can be easily controlled, and carbon dioxide is particularly excellent from the viewpoint that a gas barrier thin film which is substantially colorless and has high gas barrier properties can be stably obtained.

The gas barrier thin film may also contain metal elements originating from the heating element, such as Ta (tantalum) and other elements such as H (hydrogen) and N (nitrogen), in addition to Si, C and O.

Since the gas barrier plastic molded body formed by the production method according to the present embodiment is substantially colorless and has high gas barrier properties, the gas barrier plastic molded body is suitable for the use in packaging of a content which is susceptible to deterioration under the influence of oxygen and the like, and for which visibility of the content is preferred, specifically for example, a food, a chemical, a pharmaceutical, or an electronic component.

The method for producing a gas barrier plastic molded body according to the present embodiment preferably includes, after the film-forming process, a regenerating process for the heating element 18 in which an oxidizing gas is supplied to the atmosphere and the heating element is heated. When the film-forming process is repeatedly carried out while using an organosilane-based compound as a raw material gas and an oxidizing gas as an additive gas, after about 30 times, carbonization proceeds at the surface of the heating element 18, and the gas barrier properties of the gas barrier thin film 92 may deteriorate. As a countermeasure, it is preferable to carry out a regenerating process for the heating element 18, in which carbon components are removed from the surface of the heating element 18. The regenerating process for the heating element 18 can easily remove carbon components from the surface of the heating element 18 by bringing an oxidizing gas into contact with the heating element 18 that has generated heat inside the vacuum chamber 6 where the pressure has been adjusted to a predetermined pressure, and deterioration of the gas barrier properties of the gas barrier thin film 92 after continuous film formation can be suppressed. The regenerating process for the heating element 18 is preferably carried out such that the heating element 18 is caused to generate heat after an oxidizing gas has been supplied. The oxidizing gas is preferably carbon dioxide. The regenerating process for the heating element 18 may be carried out every time the film-forming process is carried out, or may be carried out after the film-forming process is carried out several times. Furthermore, the regenerating process for the heating element 18 is preferably carried out after the film-forming process, after the plastic molded body has been removed from the vacuum chamber 6.

In the regenerating process for the heating element 18, the heating temperature of the heating element 18 is preferably from 1900° C. to 2500° C. The heating temperature is more preferably from 2000° C. to 2400° C. The heating time is preferably from 0.5 times to 3.0 times the duration of film formation. Furthermore, when the oxidizing gas that is supplied is carbon dioxide, the pressure inside the vacuum chamber (hereinafter, also referred to as the vacuum pressure at the time of regeneration) during the regenerating process for the heating element 18 is preferably higher than or equal to 1.3 Pa and lower than 14 Pa. The pressure is more preferably from 1.4 Pa to 13 Pa. The vacuum pressure at the time of regeneration is preferably higher than 1 time and less than or equal to 9 times the partial pressure of the raw material gas 33 inside the vacuum chamber at the time of film formation (hereinafter, also referred to as the partial pressure of the raw material gas at the time of film formation). If the vacuum pressure at the time of regeneration is one time or less the partial pressure of the raw material gas at the time of film formation, the rate of accumulation of carbides exceeds the rate of removal, and when film formation is carried out continuously on plural molded bodies, the gas barrier properties of the films formed in the latter half may become poorer than the gas barrier properties of the films formed in the first half. Furthermore, if the vacuum pressure at the time of regeneration is higher than 9 times the partial pressure of the raw material gas at the time of film formation, in addition to the removal of carbides, oxidation of the surface of the heating element 18 occurs, and due to the incorporation of oxide components into the gas barrier thin film, or due to the consumption of the heating element 18 caused by evaporation, the gas barrier properties of the film formed in the latter half may deteriorate at the time of continuous film formation. Meanwhile, the supply route of the oxidizing gas into the vacuum chamber 6 during the regenerating process for the heating element 18 may be the same as the supply route for the raw material gas in the film-forming process, or may be a route different from the supply route for the raw material gas.

Next, the principle in which the gas barrier properties of the gas barrier thin film decrease when the film-forming process is repeated, and the effect of the regenerating process for the heating element 18 will be described by taking as an example the case in which the heating element was tantalum metal of a purity of 99.5% by mass, this was heated to 2000° C., and the film-forming process was repeatedly carried out continuously for 100 times. Here, the analysis of the surface of the heating element was carried out by observing the element composition at a depth of 1 μm from the surface of the heating element using a scanning electron microscope (manufactured by Hitachi, Ltd., SU1510), and by using an energy dispersive X-ray analyzer (manufactured by Horiba, Ltd., EMAX ENERGY) attached to the same apparatus. It was confirmed that while the element concentration of carbon was less than 1 at. % before film formation, the element concentration of carbon increased up to 50 at % at the maximum after repetition of the film-forming process continuously for 100 times. When this was normalized on a mass basis, the element concentration was less than 0.13% by mass before film formation, and the element concentration was 6.2% by mass at the maximum after repetition of the film-forming process continuously for 100 times. The electrical resistance of the carbides produced at the surface of the heating element is larger compared with the electrical resistance of tantalum metal that forms the core of the heating element. Therefore, when the surface of the heating element is carbonized, even if the surface is electrified, the temperature does not easily increase. Then, a temperature sufficient for the formation of the gas barrier thin film 92 cannot be secured, and a compact film having high gas barrier properties may not be obtained. When the voltage that is applied to the heating element 18 is increased, and the temperature increase is sufficiently applied even to the surface of the heating element, in the case of a PET bottle, a gas barrier thin film 92 capable of enhancing the gas barrier properties 10 times or more can be formed. However, in a mass production process, the control of adjusting the applied voltage according to the rapid change in electrical resistance at the surface of the heating element is complicated. Thus, by performing the regenerating process for the heating element 18, complicated control of the applied voltage becomes unnecessary, and even if the film-forming process is continuously carried out, a thin film having high gas barrier properties can be formed continuously.

EXAMPLES

Next, the present invention will be described in more detail by way of Examples, but the present invention is not construed to be limited to the Examples.

Example 1

A gas barrier thin film was formed on the inner surface of a 500-ml PET bottle (height: 133 mm, outer diameter of the cylinder: 64 mm, outer diameter of the opening: 24.9 mm, inner diameter of the opening: 21.4 mm, thickness: 300 μm, and resin amount: 29 g) as a plastic molded body, using a film-forming apparatus such as illustrated in FIG. 1. The pipe from gas flow rate regulators 24a to 24c to a gas supply port 16 was constructed with a ¼-inch pipe made of alumina. The PET bottle was accommodated in a vacuum chamber 6, and the pressure was reduced to 1.0 Pa. Subsequently, two tantalum wires having a diameter of 0.5 mm and a length of 44 cm were used as heating elements 18, and a direct current was applied to the heating elements 18 at 25 V to cause the heating elements to generate heat to 2000° C. Thereafter, vinylsilane as a raw material gas was supplied through the gas flow rate regulator 24a at a flow rate of 50 sccm, and simultaneously with the raw material gas, carbon dioxide as an additive gas was supplied through the gas flow rate regulator 24b at a flow rate of 30 sccm. Thus, a thin film was deposited on the inner surface of the PET bottle. The pressure (total pressure) at the time of film formation was set to 6 Pa, the duration of film formation was set to 6 seconds. At this time, the partial pressure of vinylsilane (partial pressure of the raw material gas at the time of film formation) was 1.4 Pa. The film thickness was 30 nm. Meanwhile, the film thickness is a value measured using a probe type step gauge (mode: α-step, manufactured by KLA-Tencor Corp.).

Example 2

A thin film was formed on the inner surface of a PET bottle according to Example 1, except that the supply amount of the additive gas used in Example 1 was changed to 10 sccm.

Example 3

A thin film was formed on the inner surface of a PET bottle according to Example 1, except that the supply amount of the additive gas used in Example 1 was changed to 20 sccm.

Example 4

A thin film was formed on the inner surface of a PET bottle according to Example 1, except that the supply amount of the additive gas used in Example 1 was changed to 50 sccm.

Example 5

A thin film was formed on the inner surface of a PET bottle according to Example 1, except that the supply amount of the additive gas used in Example 1 was changed to 100 sccm.

Example 6

A thin film was formed on the inner surface of a PET bottle according to Example 1, except that the additive gas used in Example 1 was changed from carbon dioxide to oxygen, and the supply amount of the additive gas was changed to 5 sccm. Here, the duration of film formation required to adjust the film thickness of the gas barrier thin film to 30 nm was 6 seconds.

Example 7

A thin film was formed on the inner surface of a PET bottle according to Example 6, except that the supply amount of the additive gas used in Example 6 was changed to 6 sccm.

Example 8

A thin film was formed on the inner surface of a PET bottle according to Example 6, except that the supply amount of the additive gas used in Example 6 was changed to 25 sccm.

Example 9

A thin film was formed on the inner surface of a PET bottle according to Example 6, except that the supply amount of the additive gas used in Example 6 was changed to 50 sccm.

Example 10

A thin film was formed on the inner surface of a PET bottle according to Example 1, except that the film thickness of the thin film used in Example 1 was changed to 5 nm.

Example 11

A thin film was formed on the inner surface of a PET bottle according to Example 1, except that the film thickness of the thin film used in Example 1 was changed to 82 nm.

Example 12

A thin film was formed on the inner surface of a PET bottle according to Example 1, except that the additive gas used in Example 1 was changed from carbon dioxide to a mixed gas prepared by mixing carbon dioxide and oxygen at 9:1. The supply amount of the additive gas listed in Table 1 indicates the supply amount of the mixed gas of carbon dioxide and oxygen.

Example 13

A thin film was formed on the inner surface of a PET bottle according to Example 1, except that the raw material gas used in Example 1 was changed from vinylsilane to a mixed gas prepared by mixing vinylsilane and acetylene at 1:1. The supply amount of the raw material gas listed in Table 1 indicates the supply amount of the mixed gas of vinylsilane and acetylene.

Example 14

A thin film was formed on the inner surface of a PET bottle according to Example 1, except that the raw material gas used in Example 1 was changed from vinylsilane to disilabutane, the additive gas was changed from carbon dioxide to oxygen, and the supply amount of the additive gas was changed to 5 sccm. Here, the duration of film formation required to adjust the film thickness of the gas barrier thin film to 30 nm was 8 seconds.

Example 15

A thin film was formed on the inner surface of a PET bottle according to Example 1, except that the supply amount of the additive gas used in Example 1 was changed to 3 sccm.

Example 16

A thin film was formed on the inner surface of a PET bottle according to Example 1, except that the supply amount of the additive gas used in Example 1 was changed to 130 sccm.

Example 17

A thin film was formed on the inner surface of a PET bottle according to Example 1, except that the additive gas used in Example 1 was changed from carbon dioxide to oxygen, and the supply amount of the additive gas was changed to 2 sccm.

Example 18

A thin film was formed on the inner surface of a PET bottle according to Example 1, except that the additive gas used in Example 1 was changed from carbon dioxide to oxygen, and the supply amount of the additive gas was changed to 65 sccm.

Example 19

A thin film was formed on the inner surface of a PET bottle according to Example 1, except that the thermal catalyst body used in Example 1 was changed to $TaC_X$ (X=1, the mass ratio of carbon atoms in $TaC_X$ was 6.2% by mass, and the element concentration of carbon atoms in $TaC_X$ was 50 at. %).

Comparative Example 1

A thin film was formed on the inner surface of a PET bottle according to Example 1, except that the additive gas used in Example 1 was not supplied.

Comparative Example 2

A thin film was formed on the inner surface of a PET bottle according to Example 1, except that the raw material gas used in Example 1 was changed from vinylsilane to a mixed gas prepared by mixing monomethylsilane and acetylene at 1:1, and the additive gas was not supplied.

Comparative Example 3

A thin film was formed on the inner surface of a PET bottle according to Comparative Example 2, except that carbon dioxide was supplied at a rate of 30 sccm as the additive gas used in Comparative Example 2.

Comparative Example 4

A thin film was formed on the inner surface of a PET bottle according to Example 1, except that the heating element used in Example 1 was changed from tantalum wires to iridium wires. However, the film thickness of the thin film was not made thick, and the film thickness was less than 3 nm.

The PET bottles having gas barrier thin films of Examples and Comparative Examples thus obtained were subjected to an evaluation by the following methods. The evaluation results are presented in Table 1.

infrared/visible/near-infrared ranges) manufactured by the same company. Regarding the detector, an ultra-high sensitivity photomultiplier tube (R928: for ultraviolet/visible ranges) and a cooling type PbS (for near-infrared range) were used. Regarding the measurement wavelength, the transmittance was measured in a wavelength range of from 240 nm to 840 nm. The measurement site was set at a position 60 mm apart from the bottom of the PET bottle. By measuring the transmittance of the PET bottle, the transmittance measurement of the gas barrier thin film only can be calculated; however, the b* value of the present Example directly represents a value calculated in a form also involving the absorptivity of the PET bottle. Meanwhile, the correlation by visual inspection with b* according to the present invention is approximately as listed in Table 2. The b* value of the PET bottle without a thin film formed therein was in the range of 0.6 to 1.0. The determination criteria for the transparency evaluation were as follows.

Determination criteria for transparency evaluation:

⊙: The b* value is 2 or less (practical use level).

○: The b* value is greater than 2 and less than or equal to 4 (practical use level).

TABLE 1

| | Kind of raw material gas | Kind of additive gas | Supply amount of raw material gas [sccm] | Supply amount of additive gas [sccm] | Kind of heating element | Film thickness [nm] | b* value | Evaluation of transparency | BIF | Evaluation of gas barrier properties | Comprehensive evaluation |
|---|---|---|---|---|---|---|---|---|---|---|---|
| Example 1 | Vinylsilane | $CO_2$ | 50 | 30 | Ta | 30 | 2.2 | ○ | 9.5 | ⊙ | ○ |
| Example 2 | Vinylsilane | $CO_2$ | 50 | 10 | Ta | 30 | 2.8 | ○ | 10.1 | ⊙ | ○ |
| Example 3 | Vinylsilane | $CO_2$ | 50 | 20 | Ta | 30 | 3.0 | ○ | 12.2 | ⊙ | ○ |
| Example 4 | Vinylsilane | $CO_2$ | 50 | 50 | Ta | 30 | 1.8 | ⊙ | 3.9 | Δ | ○ |
| Example 5 | Vinylsilane | $CO_2$ | 50 | 100 | Ta | 30 | 1.3 | ⊙ | 3.1 | Δ | ○ |
| Example 6 | Vinylsilane | $O_2$ | 50 | 5 | Ta | 30 | 5.6 | Δ | 6.0 | ○ | ○ |
| Example 7 | Vinylsilane | $O_2$ | 50 | 6 | Ta | 30 | 5.2 | Δ | 6.0 | ○ | ○ |
| Example 8 | Vinylsilane | $O_2$ | 50 | 25 | Ta | 30 | 1.3 | ⊙ | 2.8 | Δ | ○ |
| Example 9 | Vinylsilane | $O_2$ | 50 | 50 | Ta | 30 | 0.7 | ⊙ | 2.3 | Δ | ○ |
| Example 10 | Vinylsilane | $CO_2$ | 50 | 30 | Ta | 5 | 0.6 | ⊙ | 2.2 | Δ | ○ |
| Example 11 | Vinylsilane | $CO_2$ | 50 | 30 | Ta | 82 | 6.0 | Δ | 30.6 | ⊙ | ○ |
| Example 12 | Vinylsilane | $CO_2 + O_2$ | 50 | 30 ($CO_2$/$O_2$ = 27/3) | Ta | 30 | 2.0 | ⊙ | 5.5 | ○ | ○ |
| Example 13 | Vinylsilane + acetylene | $CO_2$ | 50 (25 each) | 30 | Ta | 30 | 1.2 | ⊙ | 2.0 | Δ | ○ |
| Example 14 | Disilabutane | $O_2$ | 50 | 5 | Ta | 30 | 5.2 | Δ | 2.8 | Δ | ○ |
| Example 15 | Vinylsilane | $CO_2$ | 50 | 3 | Ta | 30 | 6.0 | Δ | 14.0 | ⊙ | ○ |
| Example 16 | Vinylsilane | $CO_2$ | 50 | 130 | Ta | 30 | 0.9 | ⊙ | 2.0 | Δ | ○ |
| Example 17 | Vinylsilane | $O_2$ | 50 | 2 | Ta | 30 | 6.0 | Δ | 12.1 | ⊙ | ○ |
| Example 18 | Vinylsilane | $O_2$ | 50 | 65 | Ta | 30 | 0.5 | ⊙ | 2.0 | Δ | ○ |
| Example 19 | Vinylsilane | CO2 | 50 | 30 | $TaC_x$ | 30 | 2.4 | ○ | 9.3 | ⊙ | ○ |
| Comparative Example 1 | Vinylsilane | Not used | 50 | 0 | Ta | 30 | 7.2 | X | 16.0 | ⊙ | X |
| Comparative Example 2 | Monomethyl-silane + acetylene | Not used | 50 (25 each) | 0 | Ta | 30 | 4.6 | Δ | 1.1 | X | X |
| Comparative Example 3 | Monomethyl-silane + acetylene | $CO_2$ | 50 (25 each) | 30 | Ta | 20 | 4.1 | Δ | 1.1 | X | X |
| Comparative Example 4 | Vinylsilane | $CO_2$ | 50 | 30 | Ir | <3 | 0.2 | ⊙ | 1.0 | X | X |

(Evaluation of Transparency—b* Value)

The b* value was measured using a U-3900 type automatic recording spectrophotometer manufactured by Hitachi, Ltd. attached with a 60Φ integrating sphere attachment device (for Δ: The b* value is greater than 4 and less than or equal to 6 (lower limit for practical use level).

x: The b* value is greater than 6 (inappropriate level for practical use).

TABLE 2

| | b* value | | | | |
|---|---|---|---|---|---|
| | 0~2 | 2~4 | 4~6 | 6~8 | 8~ |
| Expression by visual inspection | Colorless | Very light yellowish brown | Light yellowish brown | Slightly dark yellowish brown | Dark yellowish brown |

(Evaluation of Gas Barrier Properties—BIF)

In regard to the BIF, the value of oxygen permeability of the PET bottle obtained in the Examples or the Comparative Examples in connection with Mathematical Formula 2 was designated as the "oxygen permeability of a gas barrier plastic molded body," and the oxygen permeability of the PET bottle without a thin film formed therein was calculated as the "oxygen permeability of a plastic molded body without a thin film formed therein." The oxygen permeability was measured using an oxygen permeability measuring apparatus (type: OX-TRAN 2/20, manufactured by Modern Controls, Inc.) under the conditions of 23° C. and 90% RH, conditioning was carried out for 24 hours from the initiation of measurement, and the oxygen permeability was designated as the value obtained after the passage of 72 hours from the initiation of measurement. Meanwhile, the oxygen permeability of the PET bottle without a thin film formed therein was 0.0350 cc/container/day. The determination criteria for the evaluation of gas barrier properties are as follows.

Determination criteria for the evaluation of gas barrier properties:

⊙: The BIF is 8 or greater (practical use level).

○: The BIF is greater than or equal to 5 and less than 8 (practical use level).

Δ: The BIF is greater than or equal to 2 and less than 5 (lower limit practical use level).

×: The BIF is less than 2 (inappropriate level for practical use).

(Comprehensive Evaluation)

In regard to the comprehensive evaluation, a sample having × for none of the items for the evaluation of transparency and the evaluation of gas barrier properties was considered to be at a practical use level and was rated as ○; and a sample having × for any of the items was considered insufficient for a practical use level and was rated as ×.

As indicated in Table 1, the thin films of Example 1 to Example 19 all had a degree of coloration at a level suitable for practical use, and were at a level of being substantially colorless. Furthermore, the thin films of Example 1 to Example 19 were all thin film having gas barrier properties. Example 1 to Example 3 had BIF values of 9 or greater and b* values of 3 or less, and exhibited excellent gas barrier properties and transparency. Among these, Example 1 had the smallest b* value among Examples 1 to 3, and had particularly high transparency. Example 4 and Example 5 had b* values of 2 or less and exhibited excellent transparency; however, the BIF values were less than 5, and exhibited lower gas barrier properties compared with Example 1 to Example 3. Example 6 to Example 9 used oxygen as the oxidizing gas, and accordingly, the amount of change in BIF relative to the supply amount of the oxidizing gas was drastic as compared with Example 1 to Example 5 in which carbon dioxide gas was used as the oxidizing gas. From this, it was confirmed that carbon dioxide is preferred to oxygen as the oxidizing gas from the viewpoint that control is easy.

In Example 10, since the film thickness of the gas barrier thin film was smaller than the film thickness of Example 1, the gas barrier properties were lower than those of Example 1, but transparency was superior to that of Example 1. In Example 11, since the film thickness of the gas barrier thin film was larger than the film thickness of Example 1, transparency was lower than that of Example 1, but the gas barrier properties were higher than those of Example 1. Example 12 used a mixed gas of oxidizing gases as the additive gas, but a thin film having properties at a level suitable for practical use could be formed. Example 13 used a mixture of auxiliary raw material gases as the raw material gas, but a thin film having properties at a level suitable for practical use could be obtained. Example 14 used disilabutane as the raw material gas, but a thin film having properties at a level suitable for practical use could be obtained. When a comparison is made between Example 6 and Example 14, it could be confirmed that the time required to form a film having the same film thickness was shorter in Example 6, and vinylsilane had higher film-forming efficiency than disilabutane.

In Example 19, since almost equal transparency and gas barrier properties were obtained as compared with Example 1, it could be confirmed that tantalum carbide can produce a useful heating element as in the case of tantalum.

In Comparative Example 1, since no additive gas was supplied, the degree of coloration was at a level inappropriate for practical use. In Comparative Examples 2 and 3, since organosilane-based compounds other than the organosilane-based compound represented by (Chemical Formula 1) were used as the raw material gas, the BIF values were practically inappropriate. In Comparative Example 4, since iridium wires were used as the heating element, the BIF value was practically inappropriate. Regarding the reason, it is speculated to be because the film-forming efficiency was poorer, and the film thickness of the gas barrier thin film could not be made thicker.

Next, a test for verifying the effect of the regenerating process for the heating element 18 was carried out.

Example 20

A film-forming process was carried out 100 times according to Example 1, and after completion of every one round of the film-forming process, the regenerating process for the heating element 18 was carried out. In each regenerating process, at the time point where the pressure inside the vacuum chamber 6 reached a vacuum pressure of 1.0 Pa, $CO_2$ as the oxidizing gas was supplied to the vacuum chamber 6, and thereby the vacuum pressure was adjusted to 12.5 Pa (since the partial pressure of the raw material gas at the time of film formation was 1.4 Pa, a vacuum pressure equivalent to 9 times the partial pressure), while the heating element 18 was heated to 2000° C. for 6 seconds.

Example 21

The film-forming process was carried out 100 times according to Example 1, and after completion of every 10 rounds of the film-forming process, the regenerating process for the heating element 18 was carried out. Each regenerating process was carried out under the same conditions as in Example 20, except that the time for heating the heating element 18 was adjusted to 60 seconds.

Example 22

The film-forming process was carried out 100 times according to Example 19, and after completion of every one round of the film-forming process, the regenerating process for the heating element 18 was carried out. Each regenerating process was carried out under the same conditions as in Example 20.

Example 23

The film-forming process was carried out 100 times according to Example 19, and after completion of every 10 rounds of the film-forming process, the regenerating process for the heating element 18 was carried out. Each regenerating process was carried out under the same conditions as in Example 21.

Example 24

The regenerating process for the heating element 18 was carried out under the same conditions as in Example 20, except that on the contrary to Example 20, $CO_2$ was supplied to the vacuum chamber 6 to adjust the vacuum pressure to 1.4 Pa (a vacuum pressure equivalent to 1.0 time of the partial pressure 1.4 Pa of the raw material gas at the time of film formation).

Example 25

The regenerating process for the heating element 18 was carried out under the same conditions as in Example 20, except that on the contrary to Example 20, $CO_2$ was supplied to the vacuum chamber 6 to adjust the vacuum pressure to 1.3 Pa (a vacuum pressure equivalent to 0.93 times of the partial pressure 1.4 Pa of the raw material gas at the time of film formation).

Reference Example 1

The regenerating process for the heating element 18 was carried out under the same conditions as in Example 20, except that on the contrary to Example 20, $CO_2$ was supplied to the vacuum chamber 6 to adjust the vacuum pressure to 14 Pa (a vacuum pressure equivalent to 10.0 times of the partial pressure 1.4 Pa of the raw material gas at the time of film formation).

Reference Example 2

The film-forming process was carried out 100 times according to Example 1, but the regenerating process for the heating element 18 was not carried out.

Reference Example 3

The film-forming process was carried out 100 times according to Example 19, but the regenerating process for the heating element 18 was not carried out.

(BIF Measurement)

In Example 20 to Example 25, and Reference Example 1 to Reference Example 3, the first and $100^{th}$ BIF values of film formation were respectively measured. The measurement method and determination criteria for the BIF were carried out by the method described in section "Evaluation of gas barrier properties—BIF". The measurement results for the BIF are presented in FIG. 3.

Figure 3:
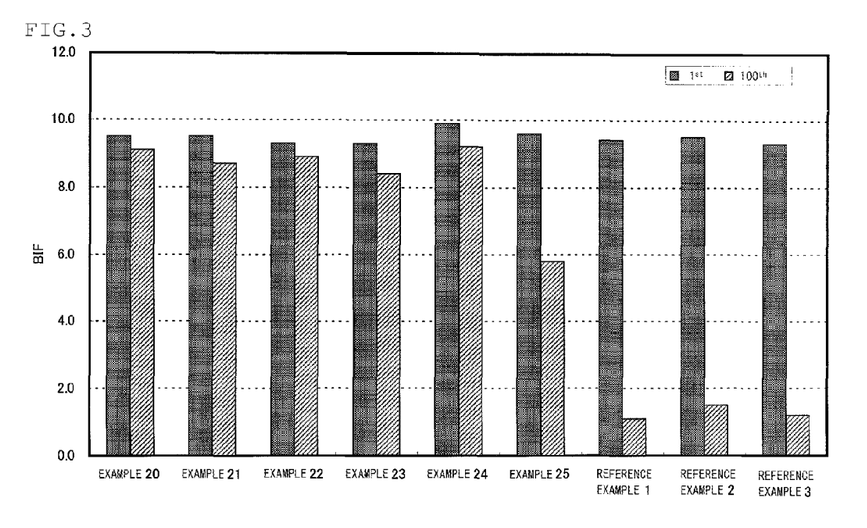
FIG. 3 is a diagram in which film formation exhibits the first and $100^{th}$ BIF values in a test for confirming a regenerating process for a heating element.

As can be seen from FIG. 3, in all of Example 20 to Example 25, both the first and $100^{th}$ BIF values were at a level suitable for practical use. Particularly, in all of Example 20 to Example 24, there was no significant difference in the gas barrier properties between the first film-forming process and the $100^{th}$ film-forming process, and the $100^{th}$ BIF value was 8 or higher. In Example 25, since the vacuum pressure at the time of regeneration was lower than the partial pressure of the raw material gas at the time of film formation, although the $100^{th}$ BIF value was 5.8, the gas barrier properties were at a level suitable for practical use. In contrast to this, in Reference Example 1 to Reference Example 3, although the gas barrier properties were satisfactory in the first film-forming process, the gas barrier properties significantly deteriorated in the $100^{th}$ film-forming process. In Reference Example 1, it is speculated that although the regenerating process for the heating element 18 was carried out, since the vacuum pressure at the time of regeneration was too high, the surface of the heating element was oxidized, and thereby the gas barrier properties were deteriorated after continuous film formation. From the above, it could be confirmed that the suitability to continuous film formation was improved by performing the regenerating process for the heating element.

Industrial Applicability

The gas barrier plastic molded body according to the present invention is suitable as a packaging material. Furthermore, a gas barrier container formed from the gas barrier plastic molded body according to the present invention is suitable as a container for beverages such as water, tea beverages, soft drinks, carbonated beverages, and fruit juice beverages.

Reference Signs List
- 6 Vacuum chamber
- 8 Vacuum valve
- 11 Plastic container
- 12 Reaction chamber
- 13 Lower chamber
- 14 O-ring
- 15 Upper chamber
- 16 Gas supply port
- 17 Raw material gas flow channel
- 17x Gas outlet port
- 18 Heating element
- 19 Wire
- 20 Heater power supply
- 21 Opening of plastic container
- 22 Exhaust pipe
- 23 Raw material gas supply pipe
- 24a, 24b, 24c Flow rate regulators
- 25a, 25b, 25c, 25d Valves
- 26a, 26b Connection areas
- 27 Cooling water flow channel
- 28 Inner surface of vacuum chamber
- 29 Cooling unit
- 30 Chamber formed from a transparent body
- 33 Raw material gas
- 34 Chemical species
- 35 Insulating ceramic member
- 40a Raw material tank
- 41a Starting raw material
- 42a, 42b, 42c Gas cylinder
- 90 Gas barrier plastic molded body
- 91 Plastic molded body
- 92 Gas barrier thin film
- 100 Film-forming apparatus

The invention claimed is:

1. A method for producing a gas barrier plastic molded body by forming a gas barrier thin film on the surface of a plastic molded body, the method comprising:
   a film-forming process in which the gas barrier thin film is formed on the surface of the plastic molded body by a heating element chemical vapor deposition (CVD)

method, using at least one organosilane-based compound selected from the group consisting of vinylsilane, disilylacetylene, and 2-aminoethylsilane as a main raw material gas, using an oxidizing gas as an additive gas, and using a heating element containing tantalum (Ta) as a main constituent element.

2. The method for producing a gas barrier plastic molded body according to claim 1, wherein the organosilane-based compound is vinylsilane.

3. The method for producing a gas barrier plastic molded body according to claim 1, wherein the oxidizing gas comprises carbon dioxide.

4. The method for producing a gas barrier plastic molded body according to claim 3, wherein the mixing ratio between carbon dioxide and the organosilane-based compound is 6:100 to 260:100.

5. The method for producing a gas barrier plastic molded body according to claim 1, wherein the oxidizing gas comprises oxygen, and the mixing ratio between oxygen and the organosilane-based compound is 4:100 to 130:100.

6. The method for producing a gas barrier plastic molded body according to claim 1, wherein the plastic molded body is a film, a sheet, or a container.

7. The method for producing a gas barrier plastic molded body according to claim 1, wherein the heating element is tantalum metal, a tantalum-based alloy, or tantalum carbide.

8. The method for producing a gas barrier plastic molded body according to claim 1, the method further comprising, after the film-forming process, a regenerating process for the heating element in which an oxidizing gas is supplied to the atmosphere and the heating element is heated.

* * * * *